US012635455B2

(12) United States Patent
Park et al.

(10) Patent No.: US 12,635,455 B2
(45) Date of Patent: May 19, 2026

(54) SEMICONDUCTOR PROCESS DEVICE AND METHOD OF MONITORING SEMICONDUCTOR PROCESS

(71) Applicant: Samsung Electronics Co., Ltd., Suwon-si (KR)

(72) Inventors: Jitae Park, Suwon-si (KR); Kwangho Lee, Suwon-si (KR); Seongjin In, Suwon-si (KR); Keonhee Lim, Suwon-si (KR); Yoonjae Kim, Suwon-si (KR); Ilwoo Kim, Suwon-si (KR); Sangki Nam, Suwon-si (KR); Sejin Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 90 days.

(21) Appl. No.: 18/647,044

(22) Filed: Apr. 26, 2024

(65) Prior Publication Data

US 2025/0087509 A1     Mar. 13, 2025

(30) Foreign Application Priority Data

Sep. 7, 2023     (KR) ........................ 10-2023-0118755

(51) Int. Cl.
H10P 72/00 (2026.01)
G01B 11/06 (2006.01)
(Continued)

(52) U.S. Cl.
CPC ...... H10P 72/0604 (2026.01); G01B 11/0641 (2013.01); G01J 3/443 (2013.01);
(Continued)

(58) Field of Classification Search
CPC .... G01B 11/0641; G01B 11/065; G01J 3/443; G05B 2219/45031; H01L 21/67253;
(Continued)

(56) References Cited

U.S. PATENT DOCUMENTS 6,362,881 B1   3/2002  Pickering et al.
6,400,458 B1   6/2002  Howald
(Continued)

FOREIGN PATENT DOCUMENTS

CN         106662531  A  *  5/2017  .............. G01J 3/443

*Primary Examiner* — Michael A Lyons
(74) *Attorney, Agent, or Firm* — Wolf, Greenfield & Sacks, P.C.

(57)     ABSTRACT

A semiconductor process device includes a housing including a chamber where a substrate is processed, a viewport in a side wall of the housing, an adapter configured to receive reflected light in which light generated from plasma generated inside the chamber is reflected at a target position on a surface of a structure provided on an upper surface of the substrate, a polarization beam splitter configured to separate the reflected light received from the adapter into P-polarized light and S-polarized light, a spectroscope configured to analyze spectra of the P-polarized light and the S-polarized light, and a control unit configured to monitor a thickness of the structure based on luminous intensity over time at one or more wavelengths of each of the P-polarized light and the S-polarized light, based on results of analyzing the spectra.

20 Claims, 10 Drawing Sheets

(51) Int. Cl.
　　G01J 3/443 　　　(2006.01)
　　G05B 19/4099 　　(2006.01)
　　H01J 37/32 　　　(2006.01)

(52) U.S. Cl.
　　CPC ...... G05B 19/4099 (2013.01); H01J 37/3244
　　　　　(2013.01); H01J 37/32972 (2013.01); *G05B*
　　　　　　*2219/45031* (2013.01); *H01J 2237/2445*
　　　　　(2013.01); *H01J 2237/24578* (2013.01); *H01J*
　　　　　　　　　　　　　*2237/332* (2013.01)

(58) Field of Classification Search
　　CPC ............. H01J 37/3244; H01J 37/32972; H01J
　　　　　　　　　2237/24578; H01J 2237/332
　　See application file for complete search history.

(56) References Cited

U.S. PATENT DOCUMENTS

| | | | |
|---|---|---|---|
| 6,585,908 | B2 | 7/2003 | Cardoso et al. |
| 6,855,567 | B1 | 2/2005 | Ni et al. |
| 7,821,655 | B2 | 10/2010 | Janos et al. |
| 9,360,302 | B2 | 6/2016 | Jensen et al. |
| 9,583,402 | B2 | 2/2017 | Ryu et al. |
| 9,847,262 | B2 | 12/2017 | Samara et al. |
| 11,320,449 | B2 | 5/2022 | Huang et al. |
| 2003/0090676 | A1 | 5/2003 | Goebel et al. |
| 2019/0013187 | A1* | 1/2019 | Meloni ............. H01J 37/32972 |
| 2022/0102122 | A1* | 3/2022 | Okamoto ........... G01B 11/0683 |
| 2023/0194342 | A1* | 6/2023 | Pylant .................. G01J 3/2803 |
| | | | 356/73 |

\* cited by examiner

SEMICONDUCTOR PROCESS DEVICE AND METHOD OF MONITORING SEMICONDUCTOR PROCESS

CROSS-REFERENCE TO RELATED APPLICATION

This application claims the benefit under 35 USC 119(a) of Korean Patent Application No. 10-2023-0118755 filed on Sep. 7, 2023, in the Korean Intellectual Property Office, the entire disclosure of which is incorporated herein by reference for all purposes.

BACKGROUND

The present inventive concept relates to a semiconductor process device and a method of monitoring a semiconductor process.

To manufacture a semiconductor device, plasma processes, such as a deposition process and an etching process, may be performed to form a structure on a semiconductor substrate. For example, a Chemical Vapor Deposition (CVD) process applies power to a chamber, supplies deposition gas, turns deposition gas into a plasma state, and uses the plasma to deposit a thin film on a semiconductor substrate.

Optical Emission Spectroscope (OES) is widely used to monitor the plasma process. For example, process monitoring may be performed by receiving light generated from plasma in a chamber and analyzing the spectrum of the received light.

SUMMARY

Example embodiments provide a semiconductor process device and a method of monitoring a semiconductor process, in which a thickness of a structure formed by alternately depositing a first material thin film and a second material thin film, different from each other, may be monitored.

Example embodiments provide a semiconductor process device and a method of monitoring a semiconductor process, in which the thickness of a structure in a specific location on a semiconductor substrate may be monitored, and uniformity of the thickness of the structure may be monitored by monitoring the thickness of a structure in a plurality of positions.

According to example embodiments, a semiconductor process device includes a housing including a chamber where a substrate is processed; a viewport in a side wall of the housing; an adapter configured to receive reflected light in which light generated from plasma generated inside the chamber is reflected at a target position on a surface of a structure provided on an upper surface of the substrate; a polarization beam splitter configured to separate the reflected light received from the adapter into P-polarized light and S-polarized light; a spectroscope configured to analyze spectra of the P-polarized light and the S-polarized light; and a control unit configured to monitor a thickness of the structure based on luminous intensity over time at one or more wavelengths of each of the P-polarized light and the S-polarized light, based on results of analyzing the spectra.

According to example embodiments, a semiconductor process device includes a housing including a chamber where a substrate is processed; a viewport in a side wall of the housing; an adapter including a plurality of light receiving units configured to receive reflected light beams generated from plasma generated inside the chamber from a plurality of target positions on a surface of a structure provided on an upper surface of the substrate; a plurality of polarization beam splitters configured to separate each of the reflected beams received from the plurality of light receiving units into P-polarized light and S-polarized light; a spectroscope configured to analyze spectra from a plurality of P-polarized light beams and a plurality of S-polarized light beams separated by the plurality of polarization beam splitters; and a control unit configured to monitor a thickness of the structure at each of the target positions based on luminous intensity over time at one or more wavelengths of each of the plurality of P-polarized lights and the plurality of S-polarized light beams, based on results of analyzing the spectra.

According to example embodiments, a semiconductor process device includes a chamber where a structure on an upper surface of a substrate is formed by performing plasma processing; and a control unit configured to: determine a target position on a surface of the structure deposited on the upper surface of the substrate; receive reflected light in which light generated by plasma generated in the chamber is reflected from the target position; detect a time point at which a peak or a valley occurs in luminous intensity over time at one or more wavelengths of each of P-polarized light and S-polarized light separated from the received reflected light; and determine a thickness of the structure at the detected time point using a reflectance model of the reflected light for a direction of polarization, the thickness of the structure, a refractive index of the surface of the structure, and an angle of incidence of the reflected light.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
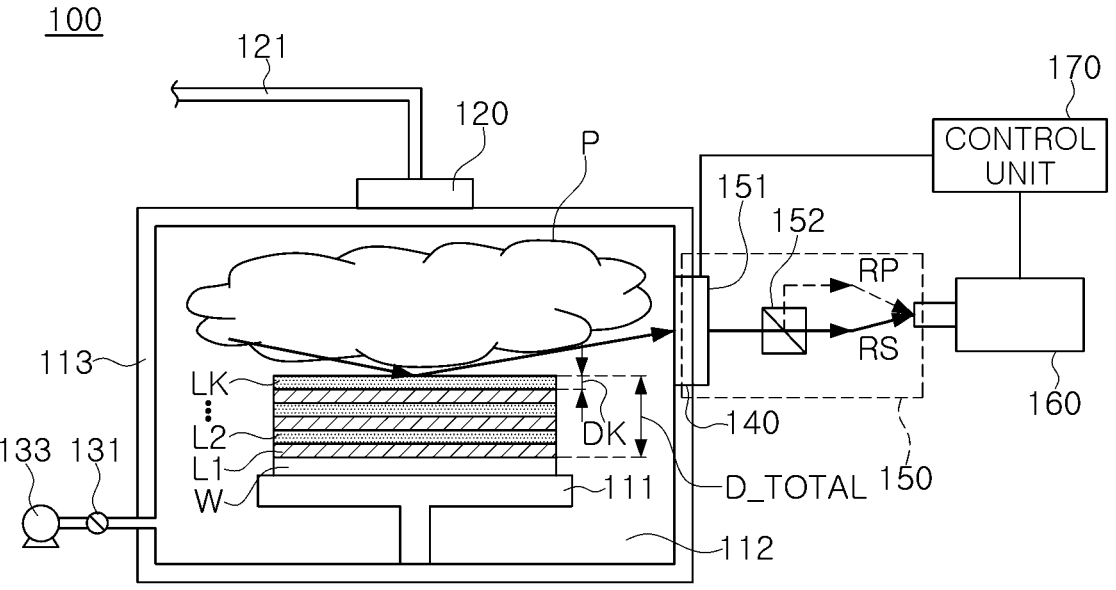
FIG. 1 is a diagram illustrating a semiconductor process device according to an example embodiment.

Hereinafter, example embodiments will be described with reference to the accompanying drawings. The same reference numerals are used for the same components in the drawings, and duplicate descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. In the present specification, although terms such as first and second are used to describe various elements or components, it goes without saying that these elements or components are not limited by these terms. These terms are only used to distinguish a single element or component from other elements or components. Therefore, it goes without saying that a first element or component referred to below may be a second element or component within the technical idea of embodiments of the present inventive concept.

FIG. 1 is a diagram illustrating a semiconductor process device according to an example embodiment.

A semiconductor process device 100 may be a device that is configured to perform a plasma process to process a substrate (W) using plasma (P). The substrate W may be a semiconductor wafer. Additionally, the plasma process may be a deposition process that deposits a structure on the upper surface of the substrate (W) by forming plasma (P) inside the chamber 112. In the example of FIG. 1, a structure may be formed by depositing a plurality of thin films (L1, L2, . . . , LK) on the upper surface of the substrate (W). However, embodiments of the present inventive concept are not limited thereto, and the plasma process may be an etching process that etches the structure deposited on the upper surface of the substrate W by forming plasma P inside the chamber 112.

Referring to FIG. 1, the semiconductor process device 100 may include a substrate chuck 111, a chamber 112, a housing 113, a gas supply unit 120, a gas supply line 121, a valve 131, a pump 133, a viewport 140, an optical system 150, a spectroscope 160, and a control unit 170.

The housing 113 may include the chamber 112 in which a plasma process is performed. The chamber 112 may be provided with the substrate chuck 111 on which the substrate W is placed. The substrate chuck 111 or the chamber 112 may include a lower electrode to which radio frequency (RF) power is applied to turn the deposition gas into a plasma state, and the upper portion of the chamber 112 may include an upper electrode. When power is applied to the lower electrode, the upper electrode may become a ground electrode.

The gas supply unit 120 may be provided on the upper portion of the housing 113. Gas for forming plasma P may be introduced through the gas supply line 121 connected to the gas supply unit 120. When the plasma process is a deposition process, the gas may contain a material to be deposited. For example, the gas may include nitrogen gas ($N_2$) for depositing a nitride film, oxygen gas ($O_2$) for depositing an oxide film, or the like. In the case in which the plasma process is an etching process, the gas may include an etching gas.

The valve 131 and the pump 133 may be connected to one side of the housing 113. The pump 133 may maintain a vacuum inside the chamber 112. Through the pump 133, unreacted gas and reaction by-products generated during the deposition process may be discharged. The valve 131 may be opened and closed depending on whether the pump 133 is operating, and the degree of vacuum inside the chamber 112 may be adjusted.

The viewport 140 may be provided on one side of the housing 113. In detail, the viewport 140 may be provided within a window structure formed on the side wall of the housing 113. For example, the viewport 140 may include quartz or sapphire. Real-time, non-destructive process monitoring may be performed by analyzing the light output from the chamber 112 through the viewport 140.

The light output from the chamber 112 through the viewport 140 may include a direct light component emitted from the plasma (P) formed on the upper surface of the structure on the substrate (W), and a reflected light component in which light emitted from plasma (P) is reflected from the upper surface of the structure. Depending on an example embodiment, the viewport 140 may be provided at approximately the same height as the upper surface of the substrate W where the chuck 111 provides a base reference plane. For example, the reflected light output to the viewport 140 may be reflected light with an incident angle of 80 degrees or more on the upper surface of the structure.

By performing process monitoring in the plasma process, a thickness (D_TOTAL) of the structure and a thickness (DK) of the individual thin films may be monitored. For example, a Vertical NAND (VNAND) device may be formed on the substrate W, and VNAND memory cells may be formed inside a structure formed by alternately depositing oxide and nitride films. In response to the demand for increasing the integration of memory cells, the number of layers of oxide and nitride layers is increasing. It may be important to improve the quality of a VNAND device, such that multiple layers of oxide and nitride films are uniformly deposited to a required thickness. Therefore, in the plasma process, monitoring may be performed to determine whether multiple layers of thin films are deposited uniformly at the required thickness.

As described above, light output through the viewport 140 may include reflected light reflected from the upper surface of the structure. As the height of the upper surface of the structure changes during the deposition process, the phase and luminosity of the reflected light output to the viewport 140 may vary depending on time. The luminous intensity of light output to the viewport 140 may have periodicity.

By detecting peaks and valleys of the brightness of light output to the viewport 140 and analyzing the periodicity, the relative thickness of the structure may be monitored based on the surface of the substrate W. However, if the light output to the viewport 140 includes reflected light components reflected from various positions on the surface of the structure, only the average thickness at various positions of the structure may be monitored.

In addition, when thin films of different materials are deposited alternately, the wavelength of light generated from the plasma of different materials is different and the refractive index may vary depending on the surface material of the structure. Continuity of luminosity over time may be lost. In addition, in a case in which the incident angle of the reflected light received from the viewport 140 is the Brewster angle or more, the horizontally polarized P-polarization component of the reflected light and the vertically polarized S-polarization component thereof may have a phase difference. Therefore, it may be difficult to interpret the periodicity of the luminous intensity of the reflected light in which the P-polarized component and the S-polarized component are combined. Therefore, it may be difficult to monitor the absolute thickness of the structure.

According to an example embodiment, the semiconductor process device 100 may monitor the thickness (D_TOTAL) of the structure using a reflectance model according to the thickness (D_TOTAL) of the structure, the refractive index of the surface of the structure, the angle of incidence of the reflected light reflected from the surface of the structure, and the direction of polarization of the reflected light, based on the thickness (D_TOTAL) of the monitored structure, the thickness (DK) of the individual thin film may be determined. The semiconductor process device 100 may use the optical system 150, the spectroscope 160, and the control unit 170 to monitor the thickness (D_TOTAL) of the structure.

The optical system 150 may be configured to transmit reflected light output through the viewport 140 to the spectroscope 160. According to an example embodiment, the optical system may include an adapter 151 and a polarization beam splitter 152. The adapter 151 may acquire only the components incident on the surface of the structure at a predetermined angle of incidence from the reflected light output through the viewport 140. Additionally, the polarization beam splitter 152 may separate the reflected light obtained from the adapter 151 into P-polarized light (RP) and S-polarized light (RS) according to the direction of polarization.

The spectroscope 160 acquires P-polarized light (RP) and S-polarized light (RS) output from the polarization beam splitter 152, and a spectral analysis of P-polarized light (RP) and S-polarized light (RS) may be performed. For example, spectroscope 160 may be an OES. The spectroscope 160 is configured to analyze the luminous intensity over time at the first wavelength of P-polarized light (RP), and the luminous intensity over time at the second wavelength of S-polarized light (RS).

Depending on an example embodiment, the spectroscope 160 may be a multichannel spectroscope that is configured to obtain P-polarized light (RP) from a first channel and S-polarized light (RS) from a second channel. Depending on an example embodiment, the spectroscope may include a first single-channel spectroscope that is configured to acquire P-polarized light (RP) from the first channel, and a second single-channel spectroscope that is configured to acquire S-polarized light (RS) from the second channel. The first single-channel spectroscope and the second single-channel spectroscope may be time synchronized.

The control unit 170 may be configured to monitor the thickness of the structure by applying a reflectance model according to the direction of polarization of the reflected light to the time-dependent luminous intensity of P-polarized light (RP) and S-polarized light (RS) analyzed from the spectroscope 160.

For example, in the reflectance model, the refractive index of the surface of the structure may be determined in advance depending on the type and deposition method of the material deposited on the surface, and may be obtained by depositing a single material on the upper surface of a substrate and then applying ellipsometry. However, the angle of incidence of reflected light, direction of polarization, reflectivity, and thickness of the structure may be unknown.

According to an example embodiment, the angle of incidence of reflected light obtained by the adapter 151 may be specified in the reflectance model, and the reflected light may be separated into P-polarized light (RP) and S-polarized light (RS) by the polarization beam splitter 152. In addition, based on the luminous intensity of P-polarized light (RP) and S-polarized light (RS) over time, the phase of the reflectance at a specific time point may be determined. For example, the control unit 170 may be configured to specify the unknowns of the reflectance model according to the direction of polarization, and the thickness of the structure may be determined using the reflectance model.

Below, the semiconductor process device and a method of monitoring a semiconductor process according to an example embodiment are described in detail with reference to FIGS. 2 to 7B.

Figure 2:
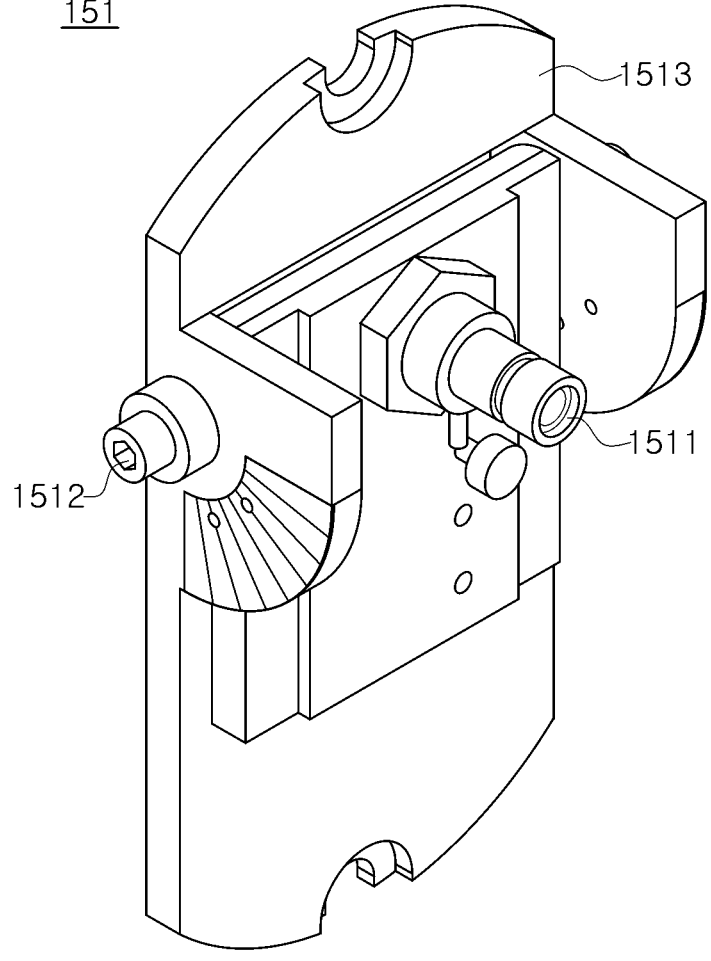
FIG. 2 is a diagram illustrating an adapter according to an example embodiment.

FIG. 2 is a diagram illustrating an adapter according to an example embodiment.

Referring to FIG. 2, the adapter 151 may include a light receiving unit 1511, a rotating unit 1512, and a fixing portion 1513. The adapter 151 in FIG. 2 may correspond to the adapter 151 described with reference to FIG. 1.

The light receiving unit 1511 may be configured to acquire reflected light output through the viewport 140 and reflected from the surface of the structure. The numerical aperture of the light receiving unit 1511 may be limited, and in practice, only reflected light reflected at a determined angle of incidence may be obtained from a limited area of the surface of the structure. For example, the light receiving unit 1511 may be composed of a collimation lens configured to acquire parallel light, a pinhole, or a combination thereof.

The rotating unit 1512 may be configured to adjust the angle of incidence of reflected light that the light receiving unit 1511 may obtain by rotating the light receiving unit 1511. If the incident angle of reflected light that may be obtained by the light receiving unit 1511 is specified, the observed position on the surface of the structure may also be specified. Therefore, the rotating unit 1512 may specify the angle of incidence of reflected light and the target position to be observed by rotating the light receiving unit 1511.

The fixing portion 1513 may be configured to fix the adapter 151 to the side wall of the housing 113.

Figure 3A:
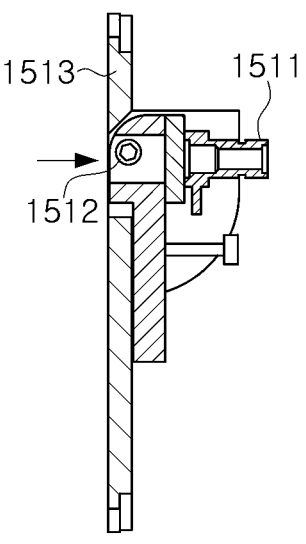
FIGS. 3A to 3C are cross-sectional views of the adapter of FIG. 2.
Figure 3B:
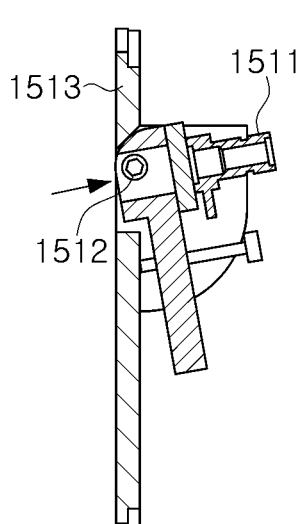
Figure 3C:
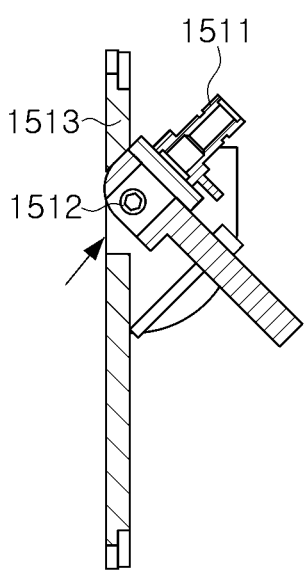

FIGS. 3A to 3C are cross-sectional views of the adapter of FIG. 2.

Referring to FIGS. 3A to 3C, the rotating unit 1512 may be configured to adjust the target incident angle and target position of the reflected light received from the light receiving unit 1511 by rotating the light receiving unit 1511 around a predetermined rotation axis. For example, the rotating unit 1512 may be configured to adjust the angle of incidence of reflected light by rotating the light receiving unit 1511 about a first rotation axis parallel to the upper surface of the substrate W and the side wall of the housing 113. However, embodiments of the present inventive concept are not limited thereto, and the rotation unit 1512 may further include a second rotation axis perpendicular to the upper surface of the substrate W.

Below, a method for monitoring the thickness of a structure at a target position based on the luminosity of reflected light with a specified angle of incidence is described in detail.

Figure 4:
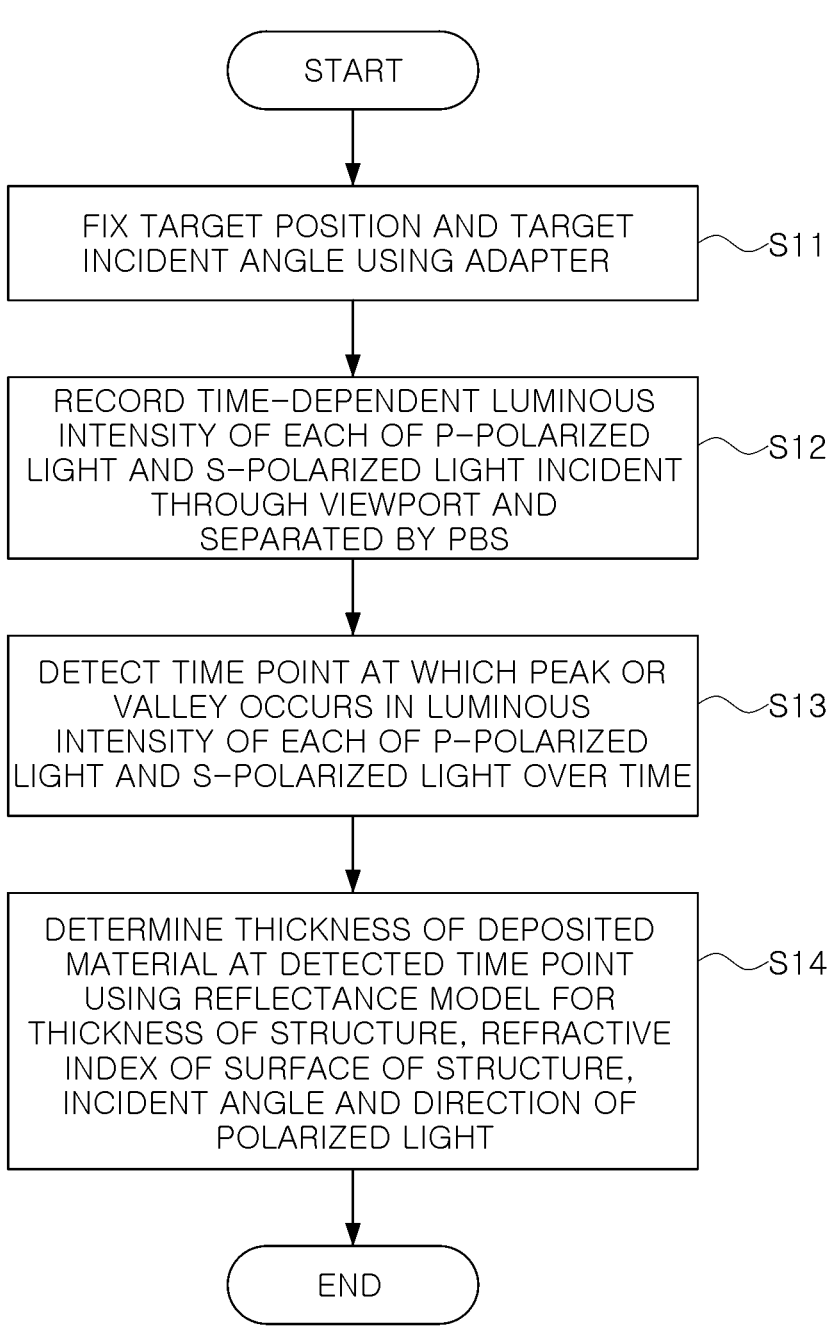
FIG. 4 is a flowchart diagram illustrating a method of monitoring a semiconductor process according to an example embodiment.

FIG. 4 is a flowchart diagram illustrating a method of monitoring a semiconductor process according to an example embodiment. It will be understood that the operations of FIG. 4 do not necessarily have to be performed in the order listed and may be performed in alternative orders in accordance with different embodiments of the inventive concept.

In operation S11, the control unit may fix the target position and target incident angle using an adapter. In a plasma process, reflected light may be output as light generated from the plasma is reflected from the surface of a structure deposited on the upper surface of a substrate. The output reflected light may enter through the viewport, and among the reflected light incident through the viewport, reflected light having the target incident angle at the target position may be received through the adapter. The reflected light received through the adapter may be separated into P-polarized light beams and S-polarized light beams by a polarization beam splitter (PBS).

In operation S12, the control unit may record the time-dependent luminous intensity of each of the P-polarized light beams and S-polarized light beams incident through the viewport and separated by a polarization beam splitter (PBS). For example, a spectroscope may decompose P-polarized light and S-polarized light according to wavelengths thereof by performing spectrum analysis of each of the P-polarized light beams and S-polarized light beams. Additionally, the control unit may record the luminous intensity over time at one or more wavelengths of P-polarized light and the luminous intensity over time at one or more wavelengths of S-polarized light.

In operation S13, the control unit may detect a time point at which a peak or a valley occurs in the luminous intensity of each of P-polarized light beams and S-polarized light beams over time.

In operation S14, the control unit may determine the thickness of the structure at the detected time point using a reflectance model for the thickness of the structure, the refractive index of the surface of the structure, the angle of incidence of reflected light, and the direction of polarized light.

The reflectance model may be defined as illustrated in Equation 1 below:

$$R_{pol} = f_{pol}(N, \theta, d_{total}) \qquad \text{[Equation 1]}$$

In Equation 1, R represents the reflectance of reflected light, and pol represents the direction of polarization, for example, P-polarized light or S-polarized light. In addition, N may represent the refractive index of the surface of the structure, $\theta$ may represent the angle of incidence of reflected light, and $d_{total}$ may represent the thickness of the structure. For example, the reflectance of P-polarized light and S-polarized light included in the reflected light may be modeled with different functions ($f_{pol}$) depending on the refractive index of the structure surface, the angle of incidence of the reflected light, and the thickness of the structure.

In detail, the reflectance model may be obtained using the Transfer Matrix Method (TMM). A transfer matrix may refer to a matrix expressing changes that occur when light passes through a certain material layer or is reflected from the material layer. A total transfer matrix representing the reflectance and transmittance of a structure including a plurality of thin films may be obtained by multiplying the individual transfer matrices of the plurality of thin films. The transfer matrix of a specific thin film may be expressed as the product of an interface matrix of the specific thin film and an adjacent thin film and a phase change matrix representing the phase change that occurs when light travels inside and through the specific thin film. As a result, the reflectance model obtained based on the total transfer matrix may be expressed as a function of the refractive index of the structure surface, the angle of incidence of reflected light, and the thickness of the structure.

On the other hand, by performing a deposition process, the reflectance may change in time series according to the thickness of the structure that changes over time. Reflectance over time may take the form of a sine wave as light of different phases repeats constructive and destructive interference due to the optical path difference caused by the thickness of the thin film. Based on the Brewster angle where the reflectance of P-polarized light is 0 or minimum, P-polarized light and S-polarized light may proceed in the same phase at an incident angle lower than the Brewster angle, but P-polarized light and S-polarized light at an incident angle higher than the Brewster angle may have a phase difference of $\pi$. In detail, at an incident angle lower than Brewster angle, the peaks and valleys of P-polarized light and S-polarized light may occur at the same time point, but at an incident angle higher than Brewster angle, the time points at which the peaks and valleys of P-polarized light and S-polarized light occur may vary.

As previously explained, the viewport may receive reflected light that is reflected at an incident angle of 80 degrees or more. In detail, the angle of incidence of reflected light received through the viewport may be higher than the Brewster angle, and the phases of P-polarized light and S-polarized light of the reflected light may be different. For example, the reflectance model for P-polarized light and the reflectance model for S-polarized light may be defined separately.

According to an example embodiment, the reflected light received from the adapter may be separated into P-polarized light beams and S-polarized light beams by a polarization beam splitter, and the reflectance model may be applied to each of P-polarized light and S-polarized light.

In the plasma process, as the thickness of the structure changes over time, the reflectance at the target incident angle may change. The luminous intensity of P-polarized light and S-polarized light over time may change depending on the reflectance. However, since it is difficult to specify the brightness of the incident light at the target position, even if the luminous intensity of P-polarized light and S-polarized light is specified, it may be difficult to accurately determine the reflectance at the target position.

According to an example embodiment, the control unit is configured to detect the time point at which a peak or valley occurs in the luminous intensity of P-polarized light and S-polarized light over time. The phase of reflectance at the detected point may be specified. In this case, the phase of reflectance may refer to the phase difference between reflected light and incident light.

The control unit is configured to apply the reflectance phase and target incident angle to the reflectance model for each of the P-polarized light and S-polarized light, and the thickness of the structure at the detected point may be determined.

Below, a process monitoring method according to an example embodiment is described in detail with reference to FIGS. 5A to 6D.

FIGS. 5A to 5D are diagrams illustrating the reflectance model according to an example embodiment.

FIGS. 5A to 5D illustrate a case where the thickness of the structure changes over time by alternately depositing the first material and the second material, and illustrate the simulation results of the reflectance of the reflected light reflected from the surface of the structure and the actual measurement results of the luminous intensity of the reflected light.

Figures 5A, 5B, 5C, 5D:
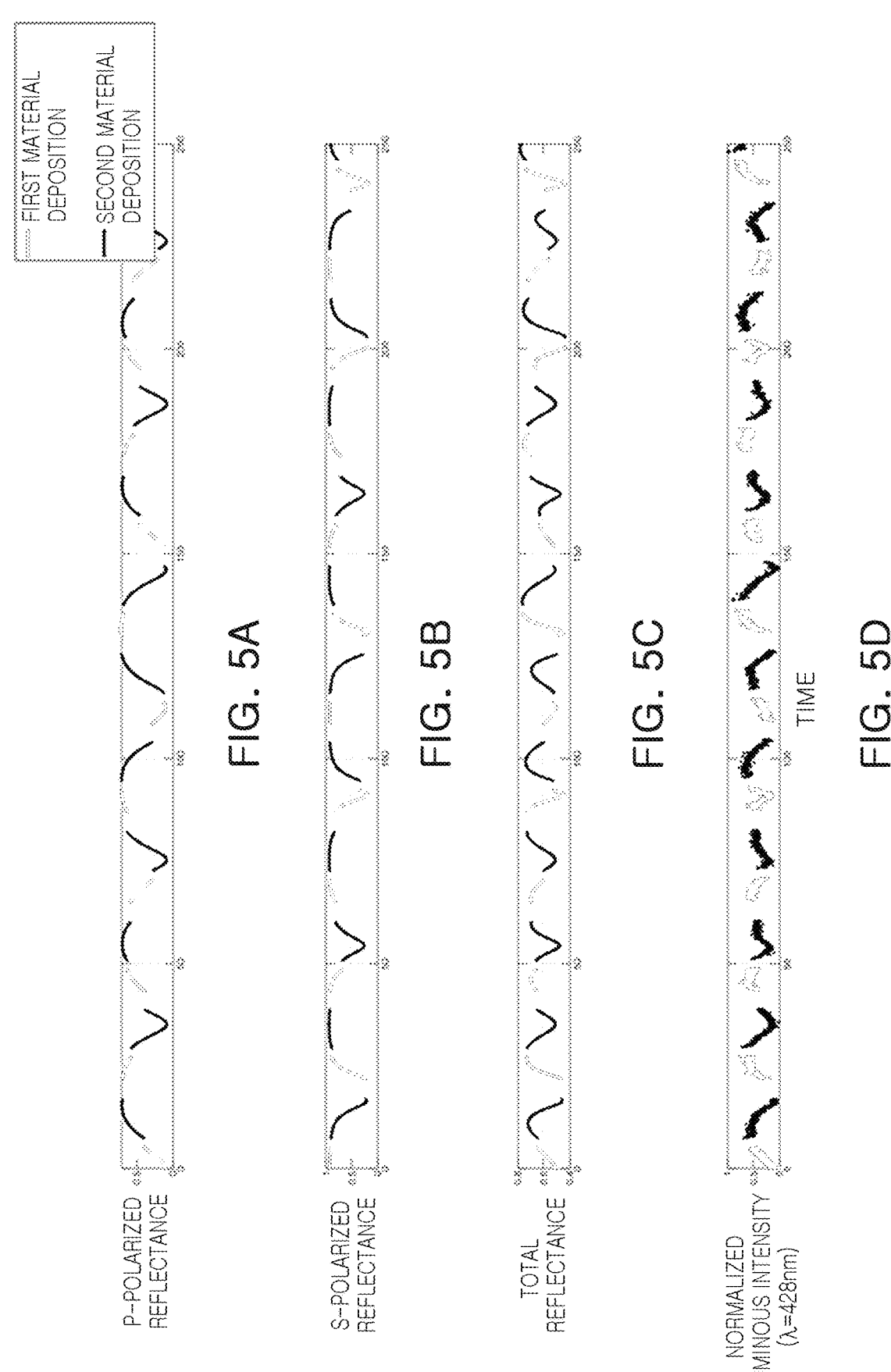
FIGS. 5A to 5D are diagrams illustrating a reflectance model according to an example embodiment.

FIG. 5A illustrates the results of simulating the reflectance of P-polarized light over time based on the reflectance model, and FIG. 5B illustrates the results of simulating the reflectance of S-polarized light over time based on the reflectance model. FIGS. 5A and 5B may illustrate the reflectance of P-polarized light and S-polarized light at a specific wavelength component for the reflected light reflected at the target incident angle.

FIG. 5C may illustrate the reflectance at a specific wavelength of reflected light reflected at the target incident angle by combining the simulation results of FIG. 5A and the simulation results of FIG. 5B. In addition, FIG. 5D may illustrate the actual measurement result of the luminous intensity at a specific wavelength of the reflected light reflected at the target incident angle. In the example of FIGS. 5A to 5D, the target angle of incidence may be 84 degrees, and the specific wavelength may be 428 nm.

Referring to FIGS. 5A and 5B, the reflectance of P-polarized light and the reflectance of S-polarized light may be discontinuous between the time when the first material is deposited and the time when the second material is deposited. However, each of the reflectance of P-polarized light and the reflectance of S-polarized light may have an approximately sinusoidal shape. In addition, the sine wave form indicated by the reflectance of P-polarized light and the sine wave form indicated by the reflectance of S-polarized light may have a phase difference of $\pi$. For example, the reflectance model for each of P-polarized light and S-polarized light according to an example embodiment may have high consistency even for target incident angles of the Brewster angle or more, and may also be effectively applied when analyzing reflected light with an incident angle of the Brewster angle or more.

Referring to FIGS. 5C and 5D, the simulation result of the reflectance of reflected light and the actual measurement result of the luminous intensity of reflected light may have similar waveforms. For example, the simulation result of reflectance and the actual measurement result of luminous intensity may have a peak or valley at almost the same time point.

Referring to FIGS. 5C and 5D, it can be seen that the reflectance models for each of P-polarized light and S-polarized light illustrated in FIGS. 5A and 5B are highly consistent with the reflectance of actual reflected light. In addition, the time point at which the peak or valley appears in the actual measurement results of the luminous intensity for each of P-polarized light and S-polarized light may be substantially the same as the time point at which the reflectance of P-polarized light and S-polarized light according to the reflectance model has a peak or valley.

As described above, even when the luminous intensity of P-polarized light and S-polarized light over time is determined, it may be difficult to specify the reflectance of P-polarized light and S-polarized light based on the luminous intensity.

According to an example embodiment, the control unit is configured to detect the time point at which each of P-polarized light and S-polarized light has a peak or valley in the luminous intensity over time, and the phase of the reflectance at the detected time point may be specified. In addition, by applying the phase of the reflectance to the reflectance model, the thickness of the structure at the detected time point may be determined.

Below, a method for determining the structure at the detected time point, according to example embodiments, is described with reference to FIGS. 6A to 6D.

FIGS. 6A to 6D are diagrams illustrating the phase of reflectance according to an example embodiment.

Figures 6A, 6B:
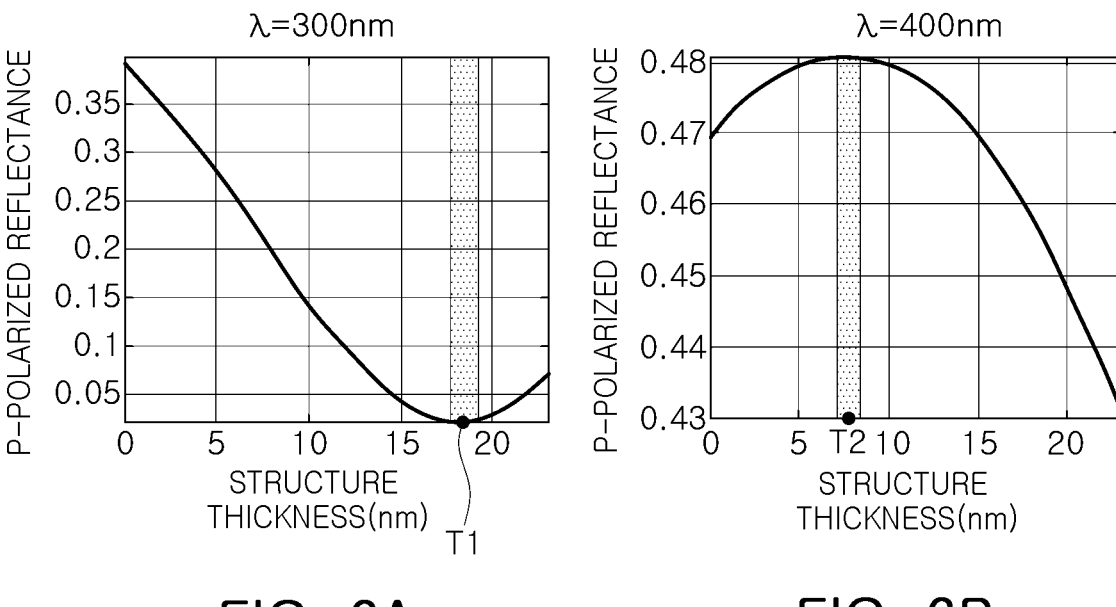
FIGS. 6A to 6D are diagrams illustrating the phase of reflectance according to an example embodiment.
Figures 6C, 6D:
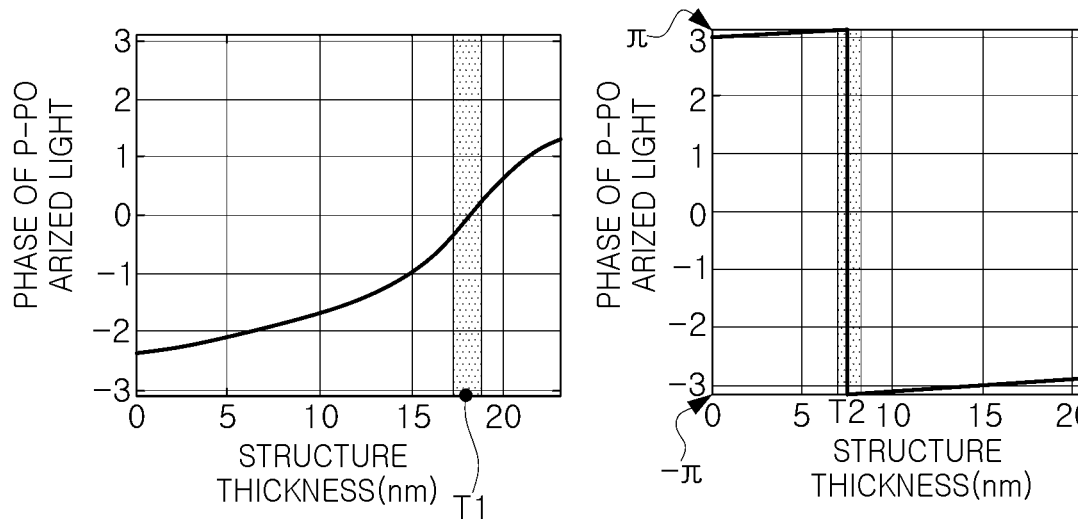

FIG. 6A illustrates the results of reflectance simulation according to the thickness of the structure for the component with a wavelength of 300 nm in P-polarized light, and FIG. 6B may illustrate the results of reflectance according to the thickness of the structure for the component with a wavelength of 300 nm in P-polarized light. FIG. 6C illustrates the phase of reflectance simulation according to the thickness of the structure for the component with a wavelength of 400 nm in P-polarized light, and FIG. 6D may illustrate the phase of reflectance according to the thickness of the structure for the component with a wavelength of 400 nm in P-polarized light.

In FIGS. 6A to 6D, the layer thickness may change in time series. In detail, the layer thickness illustrated on the horizontal axis of the graph may correspond to time. Referring to FIGS. 6A and 6C, at the same time, the reflectance of P-polarized light may vary depending on the wavelength. For example, in the reflectance model, the refractive index may change depending on the wavelength, and thus the reflectance of P-polarized light may vary depending on the wavelength.

First, referring to FIGS. 6A and 6C, at the first time point T1, the component of which a wavelength of P-polarized light is 300 nm may have a reflectance valley. When the reflectance of P-polarized light has a valley, the phase of the reflectance of the P-polarized light may be 0. It is difficult for the control unit to accurately know the reflectance of P-polarized light over time, but as described with reference to FIGS. 5A to 5D, by detecting the valley of the luminous intensity according to the time of P-polarized light, the time point at which the reflectance of P-polarized light has a valley may be detected.

According to an example embodiment, the control unit is configured to detect a first time point t1 at which the luminous intensity of P-polarized light over time has a valley, and the phase of the reflectance at the first time point t1 is determined to be 0, and by applying the phase of the reflectance, the refractive index of the surface of the structure according to the wavelength, and the target incident angle to the reflectance model for P-polarized light, the thickness of the structure at the first time point t1 may be determined.

Referring to FIGS. 6B and 6D, at the second time point T2, the reflectance of the component of which a wavelength of P-polarized light is 400 nm may have a peak. When the reflectance of the P-polarized light has a peak, the phase of the reflectance of the P-polarized light may change from $\pi$ to $-\pi$. The control unit may be configured to detect the time point at which the reflectance of P-polarized light has a peak by detecting the peak of the luminous intensity according to the time of P-polarized light.

According to an example embodiment, the control unit is configured to detect a second time point t2 at which the time-dependent luminous intensity of P-polarization peaks, and the absolute value of the phase of the reflectance at the second time point T2 may be determined as $\pi$. In addition, the control unit may be configured to determine the thickness of the structure at the second time point t2 by applying the absolute value of the phase of the reflectance, the refractive index of the surface of the structure according to the wavelength, and the target incident angle to the reflectance model for P-polarized light.

On the other hand, the control unit may use a component with a wavelength of 300 nm and a component with a wavelength of 400 nm of P-polarized light to detect two time points T1 and T2 in the time period when the layer thickness is from 0 nm to 25 nm, and the thickness of the structure at two time points T1 and T2 may be determined. If the control unit detects the time point at which the luminous intensity over time has a peak or valley based on the time-dependent luminous intensity of more wavelength components of P-polarized light, the control unit may detect more time points at a given time and determine the thickness of the structure at the detected time points. For example, the control unit may be configured to obtain data sets representing the thickness of the structure for a plurality of time points at a given time, based on the time-dependent luminous intensity of P-polarized light for one or more wavelengths.

Likewise in the case of S-polarized light, the reflectance for a certain wavelength of S-polarized light may have a waveform similar to the luminous intensity for the wavelength. At the point when the luminous intensity of S-polarized light has a peak, the absolute value of the phase of the reflectance of the S-polarized light may be $\pi$, and at the point when the luminosity of S-polarized light has a valley, the phase of the reflectance of the S-polarized light may be 0.

The control unit may be configured to determine the thickness of the structure by detecting the peak or valley of the luminous intensity of S-polarized light for one or more wavelengths over time and applying a reflectance model for the S-polarized light at the detected time point. In addition, similarly in S-polarized light, the control unit may also be configured to acquire data sets representing the thickness of the structure for a plurality of time points at a given time, based on the luminous intensity of S-polarized light over time for one or more wavelengths.

According to an example embodiment, the control unit may determine the thickness of the individual thin film included in the structure by performing regression analysis using data sets representing the thickness of the structure for a plurality of time points obtained using each of P-polarized light and S-polarized light. For example, when a structure is formed by alternately depositing a first material thin film and a second material thin film, time intervals in which the first material thin film is deposited and time intervals in which the second material thin film is deposited may be specified. The control unit may be configured to determine the thickness of an individual thin film by performing regression analysis using the data sets in each specified time period.

Figure 7A:
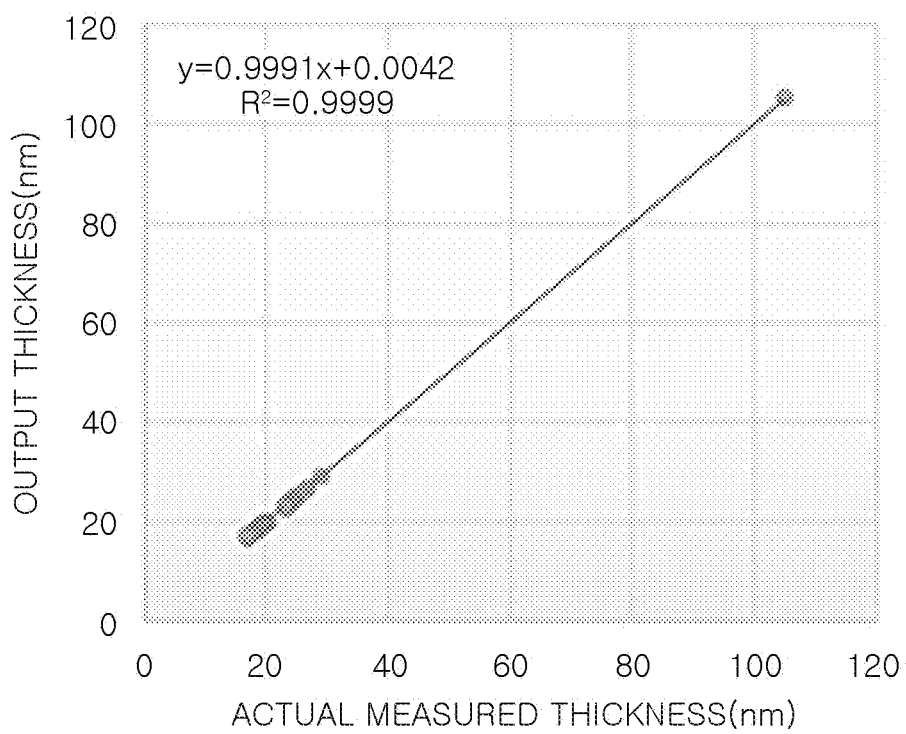
FIGS. 7A and 7B are diagrams illustrating simulation results of a method of monitoring a semiconductor process according to an example embodiment.
Figure 7B:
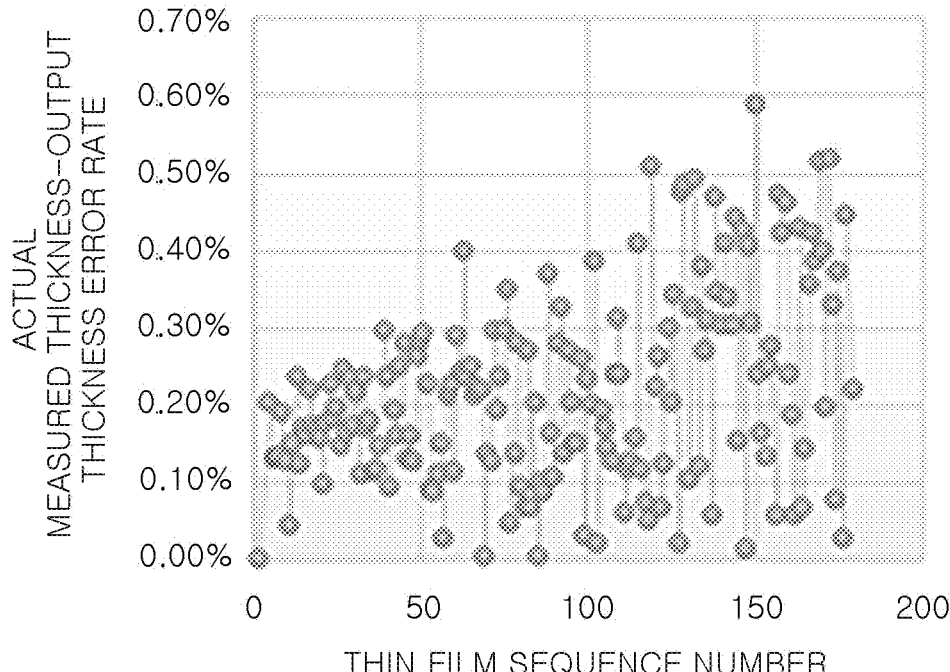

FIGS. 7A and 7B are diagrams illustrating simulation results of the method of monitoring a semiconductor process according to an example embodiment.

FIGS. 7A and 7B are graphs illustrating a result of comparing the thickness information of each thin film output by applying the method of monitoring a semiconductor process according to an example embodiment to the reflectance simulation data with the measured thickness information, after generating reflectance simulation data based on the measured thickness information and reflectance model of each of the 176 layers of mass-produced VNAND thin films.

The graph in FIG. 7A may represent the correlation between input thickness and output thickness. The input thickness represents the actual measured thickness of each thin film. Referring to FIG. 7A, the correlation between the actual measured thickness and the output thickness may be $R^2=0.9999$.

The graph in FIG. 7B is a graph illustrating the error rate between the input thickness and the output thickness depending on sequence numbers of the 176 layers of thin films. Referring to FIG. 7B, the error rate of output thickness compared to input thickness may be less than 0.6% for all 176 thin film layers.

Referring to the simulation results in FIGS. 7A and 7B, the control unit uses data sets representing the thickness of the structure obtained at time points at which the reflectivity or luminous intensity of P-polarized light and S-polarized light has peaks or valleys to perform regression analysis, thereby obtaining thickness information that is highly consistent with the actual measured thickness of each of the plurality of thin films.

On the other hand, as described above, the adapter included in the optical system may specify the target angle of incidence of reflected light and the target position to be observed. According to an example embodiment, an adapter is configured to receive reflected light from each of a plurality of target positions, and the thickness of the structure at each of the target positions may be monitored. In addition, the uniformity of the structure may be monitored based on the thickness of the structure at each target position.

Figure 8:
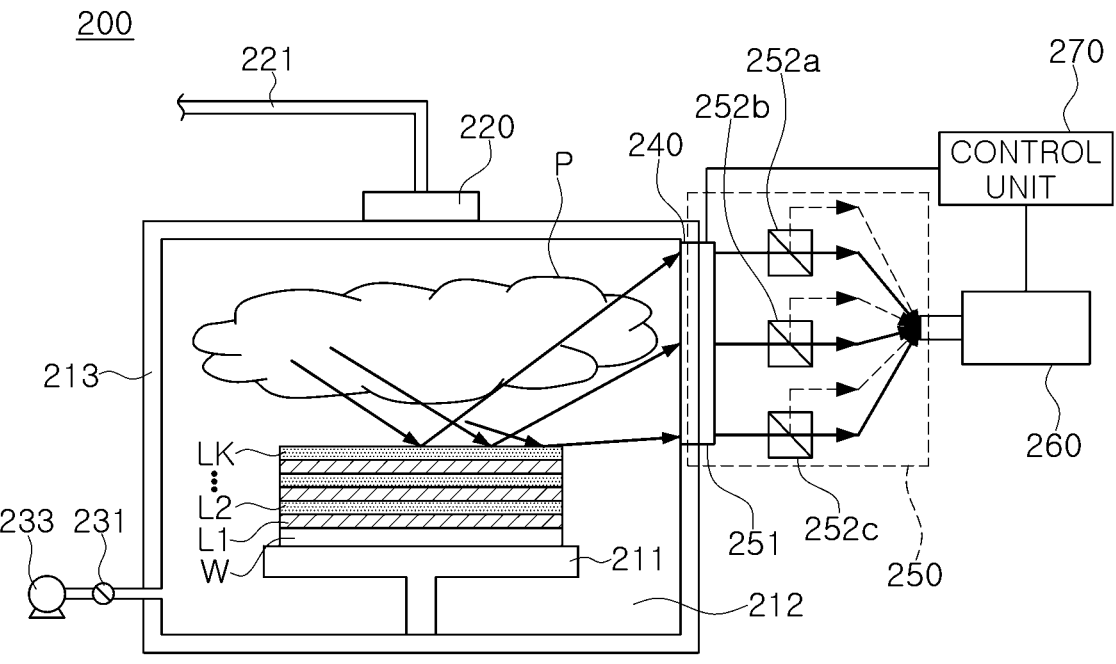
FIG. 8 is a diagram illustrating a semiconductor process device according to an example embodiment.

FIG. 8 is a diagram illustrating a semiconductor process device according to an example embodiment.

Referring to FIG. 8, a semiconductor process device 200 may include a substrate chuck 211, a chamber 212, a housing 213, a gas supply unit 220, a gas supply line 221, a valve 231, a pump 233, a viewport 240, an optical system 250, a spectroscope 260, and a control unit 270. The semiconductor process device 200 of FIG. 8 may include structures similar to the semiconductor process device 100 described with reference to FIG. 1. Below, the semiconductor process device 200 of FIG. 8 will be described focusing on the differences from the semiconductor process device 100 of FIG. 1.

The optical system 250 may include an adapter 251 and a plurality of polarization beam splitters 252a, 252b, and 252c. According to an example embodiment, the adapter 251 may include a plurality of light receiving units. For example, the plurality of light receiving units may receive different target incident angle components of the light generated from the plasma (P) reflected from different target positions of the structure formed on the substrate (W).

FIG. 8 illustrates an example where one adapter 251 includes a plurality of light receiving units, but embodiments of the present inventive concept are not limited thereto. For example, the semiconductor process device 200 may receive different target incident angle components of reflected light reflected from different target positions using a plurality of adapters, each of which includes one light receiving unit. Depending on an example embodiment, a plurality of viewports may be formed in the housing 230, and a plurality of adapters may be configured to receive reflected light from the plurality of viewports.

A plurality of reflected light beams received from a plurality of light receivers may be separated into a plurality of P-polarized light beams and a plurality of S-polarized light beams by a plurality of polarization beam splitters 252a, 252b, and 252c.

The spectroscope 260 may be configured to record the luminosity of each of the plurality of P-polarized lights and the plurality of S-polarized lights over time by performing a spectrum analysis of each of the plurality of P-polarized lights and the plurality of S-polarized lights.

The control unit 270 may be configured to determine the thickness of the structure at a plurality of target positions based on the luminous intensity over time at one or more wavelengths of each of the plurality of P-polarized light beams and the plurality of S-polarized light beams obtained from the spectroscope 260. Multiple target positions may be selected at various locations on the surface of the substrate.

Figure 9A:
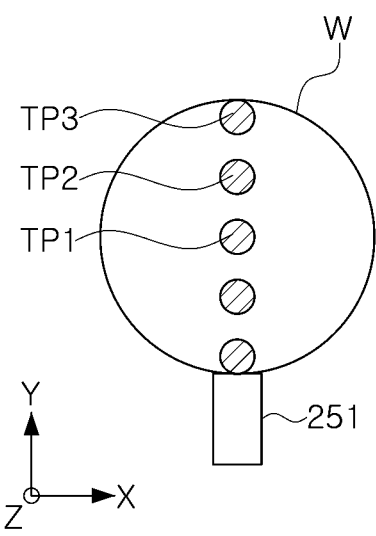
FIGS. 9A and 9B are diagrams illustrating a method of monitoring a semiconductor process according to an example embodiment.
Figure 9B:
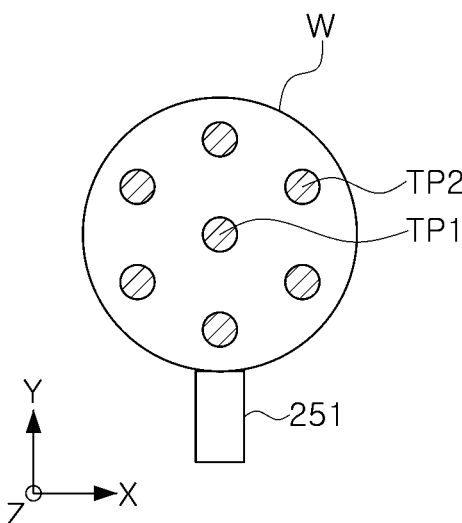

FIGS. 9A and 9B are diagrams illustrating a method of monitoring a semiconductor process according to an example embodiment.

FIGS. 9A and 9B are schematic diagrams illustrating the upper surface of the substrate W and the adapter 251 facing the substrate W in the semiconductor process device 200 described with reference to FIG. 8. In FIGS. 9A and 9B, a plurality of target positions are illustrated.

Referring to FIG. 9A, target positions TP1, TP2, and TP3 on the upper surface of the substrate W may be aligned in one direction. For example, target positions may include a first target position (TP) disposed in the center of the upper surface of the substrate (W), second target positions TP2 disposed at a first distance from the center, and third target positions TP3 disposed at positions spaced apart from the center by a second distance greater than the first distance.

Referring to FIG. 9B, target positions on the substrate W may be arranged radially. For example, target positions may include a first target position TP1 disposed in the center of the substrate W, and a plurality of second target positions TP2 disposed in a position spaced apart from the center of the substrate W by a first distance.

In the example of FIGS. 9A and 9B, the semiconductor process device 200 determines the thickness in the center and the periphery of the structure deposited on the substrate W, and thickness uniformity may be determined based on the deviation of the thickness of the structure in the center and periphery. However, target positions in embodiments of the present inventive concept are not limited to those described with reference to FIGS. 9A and 9B, and various positions on the substrate W may be selected as target positions.

According to an example embodiment, the spectroscope 260 acquires a plurality of P-polarized light beams and a plurality of S-polarized light beams generated based on reflected light beams from a plurality of target positions through different channels, and by performing spectrum analysis of the acquired plurality of P-polarized light beams and plurality of S-polarized light beams, luminous intensity information at various wavelengths for the plurality of target positions may be provided to the control unit 270.

Figure 10:
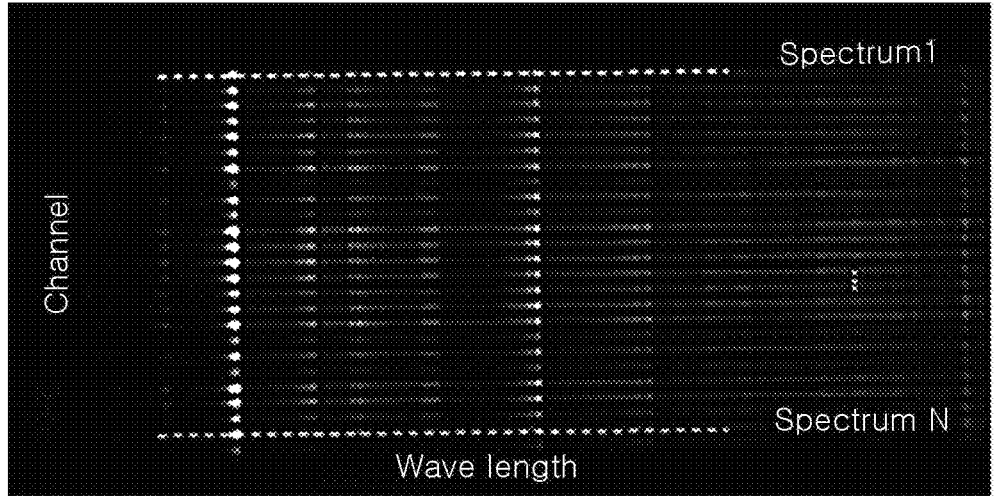
FIG. 10 is a diagram illustrating spectrum analysis results according to an example embodiment.

FIG. 10 is a diagram illustrating the results of spectrum analysis according to an example embodiment.

The spectrum analysis results in FIG. 10 illustrate a plurality of spectra (Spectrum1-Spectrum N). Each of the plurality of spectra (Spectrum1-Spectrum N) may represent the spectrum of light received from different channels. For example, each of the plurality of spectra (Spectrum1-Spectrum N) may be mapped to a plurality of P-polarized light beams and a plurality of S-polarized light beams.

Each of the plurality of spectra (Spectrum1-Spectrum N) may include luminous intensity information of reflected light according to wavelength. For example, in the spectrum analysis results of FIG. 10, the higher the luminous intensity according to the wavelength of the reflected light, the brighter the color of the dot corresponding to the wavelength.

According to an example embodiment, the spectroscope may simultaneously acquire luminous intensity information for each wavelength for each of a plurality of P-polarized light beams and a plurality of S-polarized light beams. The control unit is configured to analyze the time series change in luminous intensity information according to the wavelength of each of the plurality of P-polarized light beams and the plurality of S-polarized lights. Luminous intensity over time at one or more wavelengths of each of the plurality of P-polarized light beams and the plurality of S-polarized light beams may be obtained. The control unit may monitor the thickness of the structure for a plurality of target positions by detecting the time points when the luminous intensity has a peak or valley and applying a reflectance model.

According to an example embodiment, the target incident angle, target position, and polarization direction of reflected light from the surface of the substrate, which is output through the viewport during the plasma process, may be specified. The phase of the reflectance at a plurality of time points may be specified from the luminous intensity information in which the target incident angle and polarization direction are specified, and the thickness of the structure at the plurality of time points may be determined using a reflectance model. Therefore, the thickness of the structure may be determined by performing real-time, non-destructive monitoring of the structure formed by depositing a plurality of thin films made of different materials.

In addition, according to an example embodiment, the thickness information of an individual thin film at each of a plurality of target positions may be determined by performing a regression analysis on the thickness information of the structure at a plurality of time points, and the uniformity of the thickness of the structure may be determined based on the deviation of the thickness information of the structure at a plurality of time points.

As set forth above, in the semiconductor process device and a method of monitoring a semiconductor process according to an example embodiment, by specifying the target incident angle and the type of polarization of the reflected light reflected from the surface of a structure formed by alternately depositing different first and second material thin films and by specifying the phase of reflectance at a certain time point, a reflectance model according to the type of polarization may be applied, and the thickness of the structure at this time point may be monitored. Therefore, the thickness of the structure may be monitored in real time and non-destructively.

In the semiconductor process device and a method of monitoring a semiconductor process according to an example embodiment, the uniformity of the thickness of the structure may be monitored by monitoring the thickness of the structure at a plurality of positions.

While example embodiments have been illustrated and described above, it will be apparent to those skilled in the art that modifications and variations could be made without departing from the scope of the present inventive concept as defined by the appended claims.

What is claimed is:

1. A semiconductor process device comprising:
   a housing including a chamber where a substrate is processed;
   a viewport in a side wall of the housing;
   an adapter configured to receive reflected light in which light generated from plasma generated inside the chamber is reflected at a target position on a surface of a structure provided on an upper surface of the substrate;
   a polarization beam splitter configured to separate the reflected light received from the adapter into P-polarized light and S-polarized light;
   a spectroscope configured to analyze spectra of the P-polarized light and the S-polarized light; and
   a control unit configured to monitor a thickness of the structure based on luminous intensity over time at one or more wavelengths of each of the P-polarized light and the S-polarized light, based on results of analyzing the spectra.

2. The semiconductor process device of claim 1, wherein the control unit is configured to detect time points at which peaks or valleys of the luminous intensity occur over time at the one or more wavelengths of each of the P-polarized light and the S-polarized light, and to determine the thickness of the structure at each of the detected time points by applying a phase of a reflectance at each of the detected time points and an angle of incidence of the reflected light at the target position to a reflectance model for each of the P-polarized light and the S-polarized light.

3. The semiconductor process device of claim 2, wherein the reflectance model is determined based on a total transfer matrix calculated by multiplying transfer matrices for respective first and second material thin films included in the structure, and wherein a transfer matrix of a specific thin film is determined by multiplying an interface matrix of the specific thin film with an adjacent thin film and a phase change matrix inside the specific thin film.

4. The semiconductor process device of claim 1, wherein the adapter includes:

an optical component configured to receive light output through the viewport; and a rotator configured to set the target position by rotating the optical component.

5. The semiconductor process device of claim 4, wherein the optical component includes a collimation lens or a pinhole.

6. The semiconductor process device of claim 4, wherein the rotator includes a first rotation axis parallel to the upper surface of the substrate and the side wall of the housing.

7. The semiconductor process device of claim 6, wherein the rotator further includes a second rotation axis perpendicular to the upper surface of the substrate.

8. The semiconductor process device of claim 4, wherein the adapter is configured to be affixed to the side wall.

9. The semiconductor process device of claim 1, further comprising:

a gas supply device configured to alternately supply a first material gas and a second material gas; and a plurality of electrodes configured to apply power to the chamber to form the plasma based on the first material gas or the second material gas and by alternately depositing a first material thin film and a second material thin film on the upper surface of the substrate as the structure.

10. The semiconductor process device of claim 9, wherein the first material thin film is an oxide film, and the second material thin film is a nitride film.

11. The semiconductor process device of claim 1, wherein the spectroscope is configured to generate luminous intensity information according to a wavelength of the P-polarized light obtained through a first channel and the S-polarized light obtained through a second channel as a result of a spectrum analysis.

12. The semiconductor process device of claim 11, wherein the spectroscope includes:

a first single-channel spectroscope configured to acquire the P-polarized light through the first channel; and a second single-channel spectroscope configured to acquire the S-polarized light through the second channel, and wherein the spectroscope is configured to perform time synchronization of the first single-channel spectroscope and the second single-channel spectroscope.

13. A semiconductor process device comprising:

a housing including a chamber where a substrate is processed;

a viewport in a side wall of the housing;

an adapter including a plurality of light receiving units configured to receive reflected light beams generated from plasma generated inside the chamber from a plurality of target positions on a surface of a structure provided on an upper surface of the substrate;

a plurality of polarization beam splitters configured to separate each of the reflected light beams received from the plurality of light receiving units into P-polarized light and S-polarized light;

a spectroscope configured to analyze spectra from a plurality of P-polarized light beams and a plurality of S-polarized light beams separated by the plurality of polarization beam splitters; and a control unit configured to monitor a thickness of the structure at each of the plurality of target positions based on luminous intensity over time at one or more wavelengths of each of the plurality of P-polarized light beams and the plurality of S-polarized light beams, based on results of analyzing the spectra.

14. The semiconductor process device of claim 13, wherein the control unit is configured to determine uniformity of the thickness of the structure based on a deviation of the thickness of the structure at the respective target positions.

15. The semiconductor process device of claim 13, wherein the plurality of target positions includes:

a first target position set in a center of the upper surface of the substrate, and one or more second target positions set at a position spaced apart from a center of the upper surface of the substrate by a first distance.

16. The semiconductor process device of claim 13, wherein the spectroscope is a multichannel spectroscope configured to acquire the plurality of respective P-polarized light beams and the plurality of respective S-polarized light beams from a plurality of different channels and to perform spectrum analysis on the plurality of respective channels.

17. A semiconductor process device, comprising:

a chamber where a structure on an upper surface of a substrate is formed by performing plasma processing; and a control unit configured to:

determine a target position on a surface of the structure deposited on the upper surface of the substrate;

receive reflected light in which light generated by plasma generated in the chamber is reflected from the target position;

detect a time point at which a peak or a valley occurs in luminous intensity over time at one or more wavelengths of each of P-polarized light and S-polarized light separated from the received reflected light; and determine a thickness of the structure at the detected time point by applying a target incident angle, a phase of reflectance, and a refractive index of the surface of the structure to a reflectance model according to a direction of the polarization.

18. The semiconductor process device of claim 17, wherein the control unit determines the thickness of the structure at the detected time point by:

determining the target incident angle on the surface of the structure deposited on the upper surface of the substrate;

specifying the direction of the polarization having the peak or the valley at the detected time point;

specifying the phase of reflectance at the peak or the valley; and specifying the refractive index of the surface of the structure at a wavelength having the peak or the valley at the detected time point.

19. The semiconductor process device of claim 18, wherein the control unit forms the structure on the upper surface of the substrate by performing the plasma processing within the chamber by forming the structure on the upper surface of the substrate by alternately depositing first material thin films and second material thin films on the upper surface of the substrate.

20. The semiconductor process device of claim 19, wherein the control unit is further configured to:

determine a thickness of the structure at each of a plurality of detected time points; and determine a thickness of each of the first material thin films and the second material thin films by performing regression analysis on the thickness of the structure at each of the plurality of detected time points.

* * * * *